(12) United States Patent
Ohkawa et al.

(10) Patent No.: US 8,130,253 B2
(45) Date of Patent: Mar. 6, 2012

(54) COMPOSITE SEMICONDUCTOR DEVICE, PRINT HEAD AND IMAGE FORMING APPARATUS

(75) Inventors: Kazuya Ohkawa, Tokyo (JP); Shinya Jyumonji, Tokyo (JP); Masumi Taninaka, Tokyo (JP); Hiroshi Hamano, Tokyo (JP); Masumi Koizumi, Tokyo (JP)

(73) Assignee: Oki Data Corporation, Tokyo (JP)

( * ) Notice: Subject to any disclaimer, the term of this patent is extended or adjusted under 35 U.S.C. 154(b) by 349 days.

(21) Appl. No.: 12/457,019

(22) Filed: May 29, 2009

(65) Prior Publication Data
US 2009/0322852 A1 Dec. 31, 2009

(30) Foreign Application Priority Data

Jun. 30, 2008 (JP) .................................. 2008-171008

(51) Int. Cl.
*B41J 2/45* (2006.01)
*H01L 21/00* (2006.01)

(52) U.S. Cl. .......................................... 347/238; 438/33
(58) Field of Classification Search .................. 347/238, 347/241, 242, 256–258; 257/508, 618–620, 257/797; 438/33, 68, 113, 460
See application file for complete search history.

(56) References Cited

U.S. PATENT DOCUMENTS

2008/0042155 A1* 2/2008 Furuta et al. .................... 257/98
2009/0272973 A1* 11/2009 Yoshida et al. ................. 257/48

FOREIGN PATENT DOCUMENTS

| JP | 2000-195827 | | 7/2000 |
| JP | 2001-23937 | | 1/2001 |
| JP | 2006-332344 | | 12/2006 |
| JP | 2007189111 A | * | 7/2007 |
| JP | 2008-010571 | | 1/2008 |

* cited by examiner

*Primary Examiner* — Hai C Pham
(74) *Attorney, Agent, or Firm* — Rabin & Berdo, PC

(57) ABSTRACT

A composite semiconductor device is formed of a semiconductor wafer having a plurality of device-forming areas in which semiconductor elements are formed and dicing areas defined between the device-forming areas, and is formed by dicing the semiconductor wafer at the dicing areas. The composite semiconductor device includes a semiconductor substrate, and a plurality of wiring layers layered on the semiconductor substrate. The wiring layers include at least conductive films. Connecting portions are formed to connect the wiring layers with each other in a layering direction of the wiring layers. Each of the connecting portions is disposed on the device-forming area side with respect to a dicing position defined in the dicing area.

8 Claims, 11 Drawing Sheets

COMPARISON EXAMPLE

COMPARISON EXAMPLE

COMPARISON EXAMPLE

COMPARISON EXAMPLE

COMPOSITE SEMICONDUCTOR DEVICE, PRINT HEAD AND IMAGE FORMING APPARATUS

BACKGROUND OF THE INVENTION

The present invention relates to a composite semiconductor device such as an LED (Light Emitting Diode) array manufactured by dicing, and also relates to a print head and an image forming apparatus using the composite semiconductor device.

The composite semiconductor devices are manufactured by forming a plurality of semiconductor elements on device-forming areas of a semiconductor wafer, and by dicing the semiconductor wafer at dicing areas (between the device-forming areas) to divide the semiconductor wafer into a plurality of semiconductor chips (i.e., composite semiconductor devices).

Generally, a dicing blade that rotates at a high speed is used to divide the semiconductor wafer. When the semiconductor wafer is diced using the dicing blade, cracks or chipping may be generated on the semiconductor chips due to an external force applied by the dicing blade.

In order to prevent generation of cracks and chipping on the semiconductor chips and to thereby enhance yield rate, it is proposed to provide separate pattern portions in the dicing areas of the semiconductor wafer for preventing propagation of the force to the device-forming areas in the dicing process (see, Japanese Laid-Open Patent Publication No. 2008-010571).

Recently, in accordance with downsizing and upgrading of the semiconductor devices, a high precision dicing process has been employed. In the high precision dicing process, the semiconductor wafer is diced at a position in the close vicinity of the device-forming areas. In such a case, the effect of the separate pattern portions decreases, and cracks may be generated on the semiconductor chips. Therefore, it is demanded to prevent generation of cracks on the semiconductor chips (i.e., composite semiconductor devices) even in a high precision dicing process.

SUMMARY OF THE INVENTION

The present invention is intended to provide a composite semiconductor device capable of enhancing yield rate by preventing generation of cracks even in a high precision dicing process, and to provide a print head and an image forming apparatus using such a composite semiconductor device.

The present invention provides a composite semiconductor device formed of a semiconductor wafer having a plurality of device-forming areas in which semiconductor elements are formed and dicing areas defined between the device-forming areas, and formed by dicing the semiconductor wafer at the dicing areas. The composite semiconductor device includes a semiconductor substrate, and a plurality of wiring layers layered on the semiconductor substrate. The wiring layers include at least conductive films. Connecting portions are formed to connect the wiring layers with each other in a layering direction of the wiring layers. Each of the connecting portions is disposed on the device-forming area side with respect to a dicing position defined in the dicing area.

With such a configuration, even when a crack is generated on the dicing position due to an external force applied by a dicing blade, the connecting portions prevent the propagation of the crack to the inside of the device-forming area. Therefore, generation of cracks on the composite semiconductor device can be prevented, and yield rate can be enhanced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Hereinafter, embodiments of the present invention will be described with reference to the attached drawings.

Embodiment 1

Figure 1A:
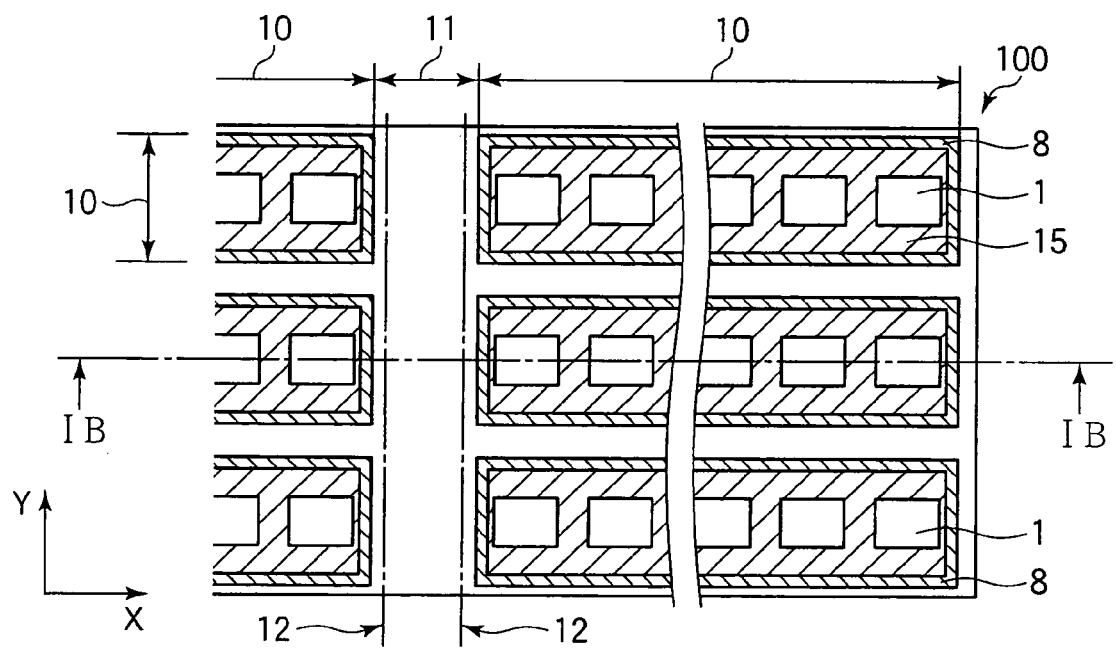
FIG. 1A is a plan view showing a composite semiconductor device according to the first embodiment of the present invention.
Figure 1B:
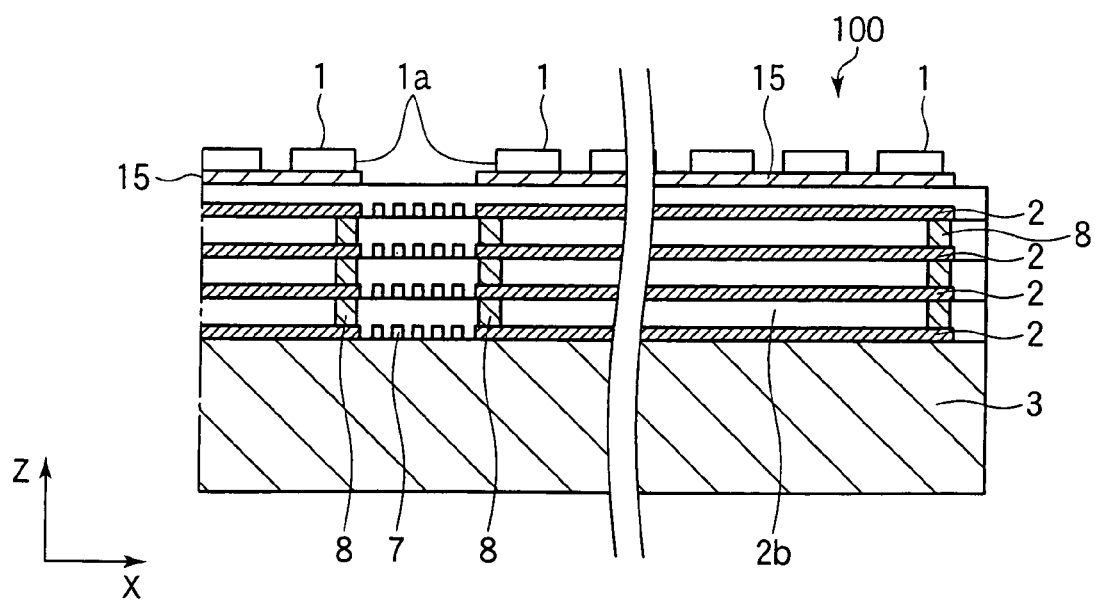
FIG. 1B is a sectional view taken along line IB-IB in FIG. 1A.

FIG. 1A is a plan view showing composite semiconductor devices 100 according to the first embodiment of the present invention before the composite semiconductor devices 100 are divided from a semiconductor wafer. FIG. 1B is a sectional view taken along line IB-IB in FIG. 1A.

As shown in FIGS. 1A and 1B, the composite semiconductor device 100 includes a semiconductor substrate 3 (for example, Si substrate) and a plurality of (in this example, four) wiring layers 2 layered on the semiconductor substrate 3. The wiring layers 2 are composed of, at least, conductive films (i.e., wiring patterns). Insulation films 2b are formed on the wiring layers 2. In this regard, there can be other components (not shown) than the insulation film 2b on or besides the wiring layers 2 as necessary.

A semiconductor thin-film layer 15 is formed on the surface of the semiconductor wafer (i.e., the substrate 3, the wiring layers 2 and the insulation films 2b). The semiconductor thin-film layer 15 has a plurality of semiconductor elements 1 as LED elements.

Device-forming areas 10 are defined on the top surface of the semiconductor wafer. The semiconductor thin-film layer 15 with a plurality of the semiconductor elements 1 is disposed in the device-forming areas 10. Dicing areas 11 are defined on the top surface of the semiconductor wafer and extend in Y direction (FIG. 1A) between the adjacent device-forming areas 10. Dicing lines 12 (i.e., dicing positions) are defined in the dicing areas 10 and extend in the Y direction in the close vicinity of the device-forming areas 10.

The wiring layers 2 can be composed of, for example, Al-based material such as AlSiCu, AlSi, AlNi, AlTi and AlCr, Cu or the like. The insulation films 2b can be composed of $SiO_2$, SOG or the like. Not shown driving circuits are formed on the wiring layers 2 for driving the semiconductor elements 1. The semiconductor thin-film layer 15 can be composed of III-V compound semiconductor (for example, GaAs, AlGaAs or the like), III-V nitride semiconductor (for example, GaN, AlGaN of the like) or the like.

In this embodiment, the wiring layers 2 extend also through the dicing area 11. In the dicing area 11, each wiring layer 2 is divided into a plurality of small sections so as to form separate pattern portion 7 which is not related to a circuit operation. Since the wiring layers 2 extend also through the dicing area 11, the difference in height between the dicing area 11 and the device-forming area 10 (due to the existence of the wiring layers 2) is reduced, and a flatness of the upper surface of the semiconductor wafer is maintained.

In this embodiment, the separate pattern portions 7 are formed at the same time as the formation of the wiring layers 2 that constitute driving circuits. However, it is also possible to form the separate pattern portions 7 using metal layers different from the wiring layers 2, as long as the flatness of the surface of the semiconductor wafer can be maintained.

The adjacent wiring layers 2 are connected to each other via connecting portions 8 in the layering direction (i.e., Z direction in FIG. 1B) of the wiring layers 2. The connecting portions 8 are formed of a material such as tungsten having excellent adhesion property, high hardness and high corrosion resistance property. Each connecting portion 8 is disposed on the device-forming area 10 side with respect to the dicing position (i.e., the dicing line 12) defined in the dicing area 11. In this example, each connecting portion 8 is formed on at least an end of the device-forming area 10 so as to face the dicing area 11. For example, the connecting portion 8 can be formed so as to surround the device-forming area 10. In this regard, the uppermost wiring layer 2 is connected to the semiconductor thin-film layer 15 via a not shown material having excellent adhesion property (for example, tungsten having high hardness and high corrosion resistance property).

The wiring layers 2 need to be connected to each other via the connecting portions 8 on at least a position between the dicing line 12 and an end 1a of the endmost semiconductor element 1 closest to the dicing line 12 (FIG. 1A). However, a width of each connecting portion 8 in the inward direction of the device-forming area 10 is not limited. Although one connecting portion 8 is provided on each device-forming area 10 side with respect to the dicing position (the dicing line 12) in FIG. 1A, two or more connecting portions 8 can be provided on each device-forming area 10 side with respect to the dicing position.

In the manufacturing process of the composite semiconductor device 10 having the above described configuration, a high precision dicing is performed in accordance with downsizing and upgrading of the composite semiconductor device 10. In the high precision dicing, the dicing is performed along the dicing lines 12 defined in the dicing area 11 in the close vicinity of the device-forming areas 10 as shown in FIG. 1A.

Figure 2:
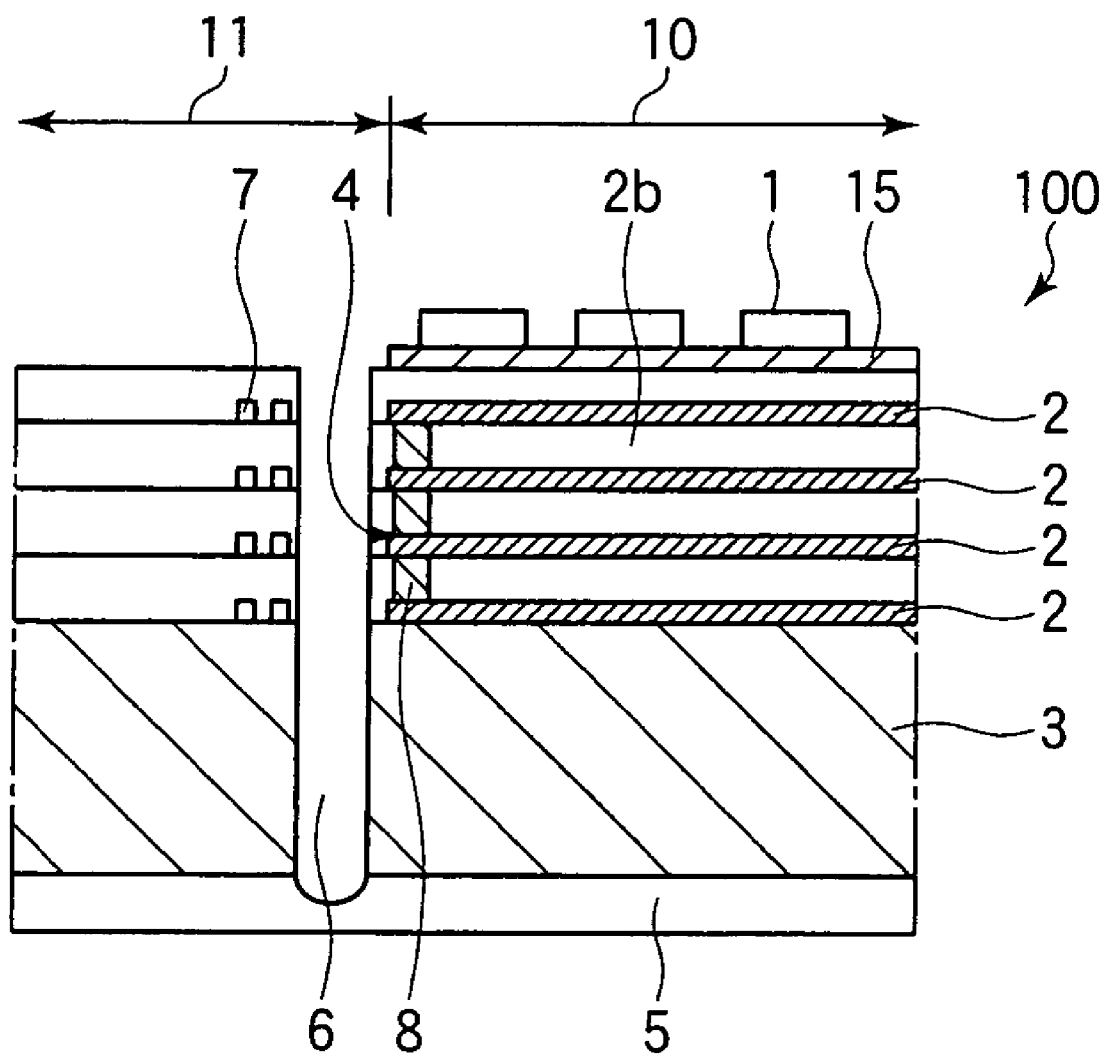
FIG. 2 is a sectional view for schematically illustrating a state of a semiconductor wafer in a dicing process according to the first embodiment of the present invention.

FIG. 2 is a sectional view for schematically illustrating a state of the semiconductor wafer in the dicing process. A reference numeral 6 indicates a cutting groove formed by a dicing blade. A reference numeral 5 indicates a tape bonded onto a backside of the semiconductor substrate 3 so as to prevent divided semiconductor chips from scattering. For example, an ultraviolet-curable dicing tape is used as the tape 5.

According to the first embodiment of the present invention, even when a crack 4 is generated from the cutting groove 5, the connecting portions 8 prevent propagation of the crack 4 to the inside of the device-forming area 10. Due to the excellent adhesion property of the connecting portions 8, the crack 4 is prevented from reaching inside the device-forming area 10.

Figure 3A:
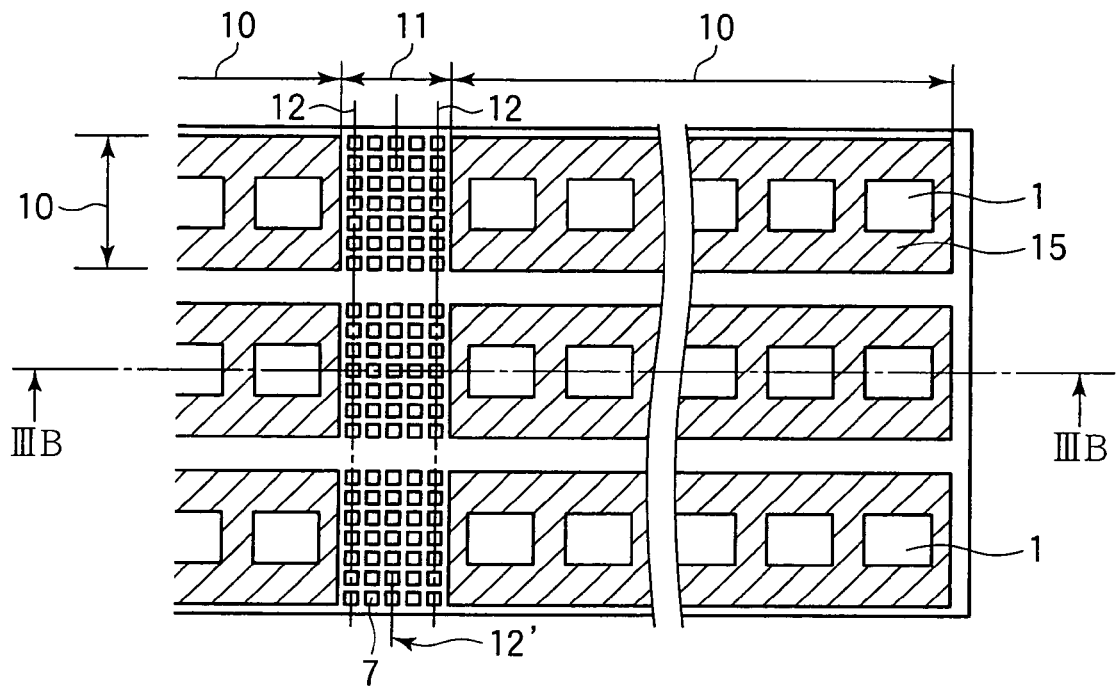
FIG. 3A is a plan view showing a composite semiconductor device according to a comparison example.
Figure 3B:
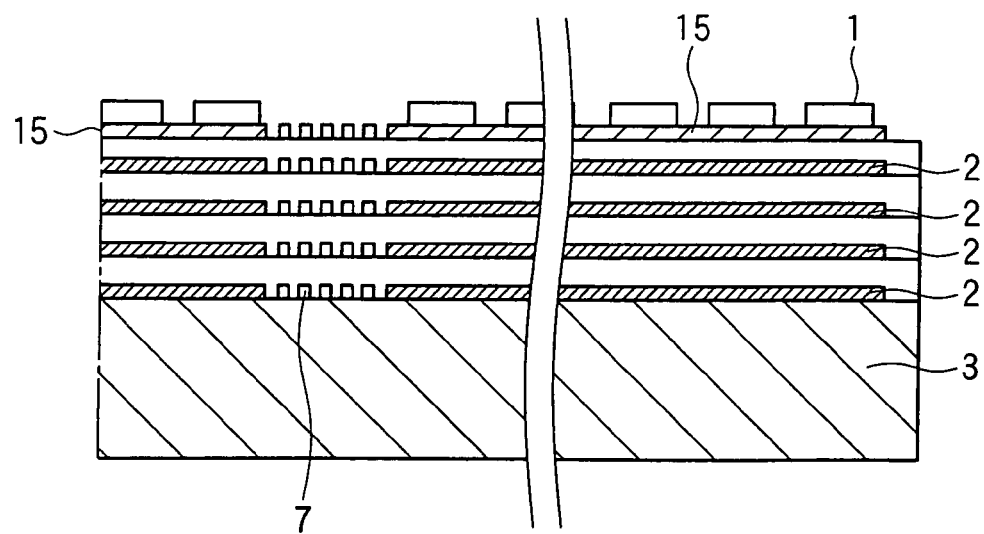
FIG. 3B is a sectional view taken along line IIIB-IIIB in FIG. 3A.
Figure 4:
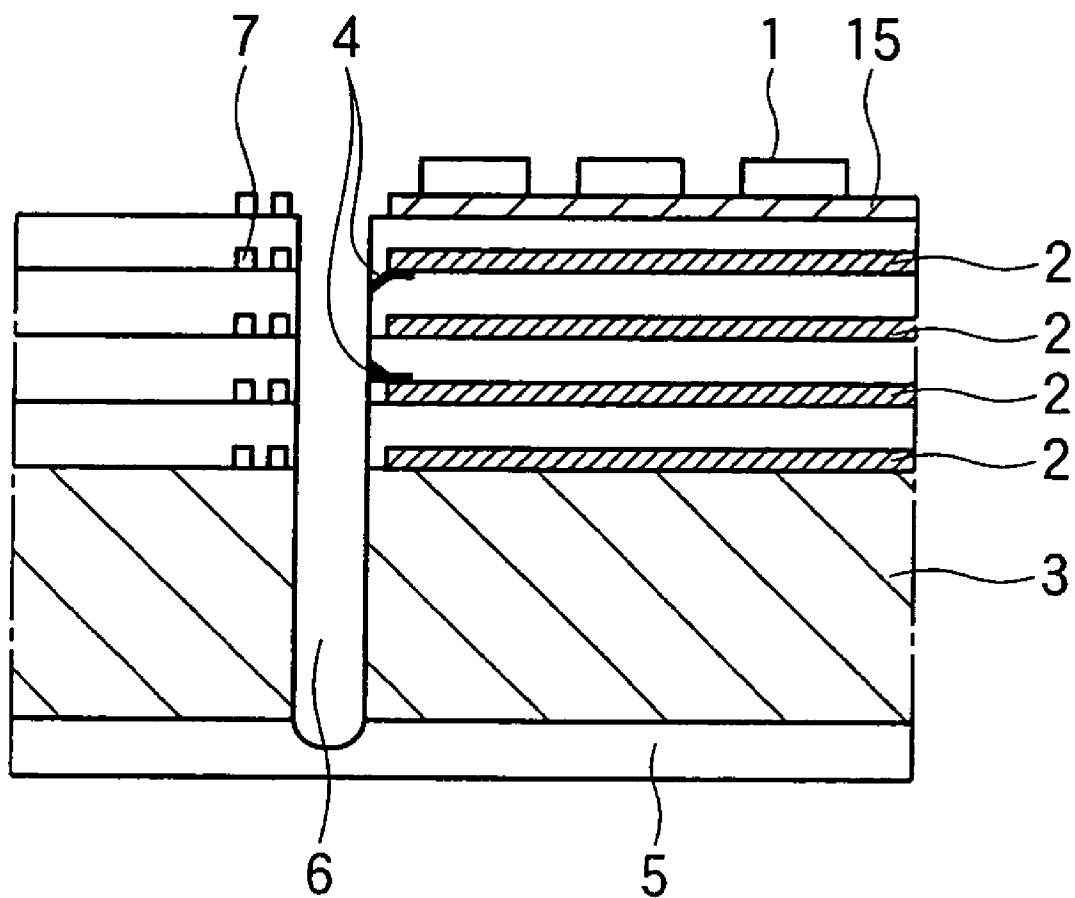
FIG. 4 is a sectional view for schematically illustrating a state of a semiconductor wafer in a dicing process according to the comparison example.

Here, a comparison example will be described. FIG. 3A is a plan view showing a composite semiconductor device according to the comparison example. FIG. 3B is a sectional view taken along line IIIB-IIIB in FIG. 3A. FIG. 4 is a sectional view for schematically illustrating a state of a semiconductor wafer in the dicing process according to the comparison example. In FIGS. 3A, 3B and 4, components that are the same as those shown in FIGS. 1A, 1B and 2 are assigned the same reference numerals.

In the comparison example, no connecting portion 8 is provided between the wiring layers 2. Instead, separate pattern portion 7 is also formed on the top surface of the semiconductor wafer.

When the dicing is performed along the dicing line 12' at the center of the dicing area 11, the separate pattern portions 7 effectively prevent propagation of the force to the device-forming area 10. However, when the dicing is performed along the dicing line 12 in the close vicinity of the device-forming area 10, the cracks 4 generated from the cutting groove 6 may propagate to the wiring layers 2 in the close vicinity of the cutting groove 6 as shown in FIG. 4. In such a case, the cracks 4 may cause separation of the wiring layers 2 and may propagate along the wiring layer 2 to the inside of the device-forming area 10.

In contrast, according to the first embodiment of the present invention, the connecting portion 8 is formed on the device-forming area 10 side with respect to the dicing position, and therefore the connecting portion 8 prevents propagation of the crack 4 to the inside of the device-forming area 10 due to the excellent adhesion property of the connecting portions 8. Therefore, the crack 4 does not affect the semiconductor chip (i.e., the composite semiconductor device 100), with the result that yield ratio in the manufacturing process of the composite semiconductor device 100 can be enhanced.

Next, a manufacturing method of the composite semiconductor device 100 according to the first embodiment of the present invention will be described.

FIGS. 5A through 5F and FIGS. 6A through 6F show the manufacturing method of the composite semiconductor device 100 according to the first embodiment of the present invention.

Figure 5A:
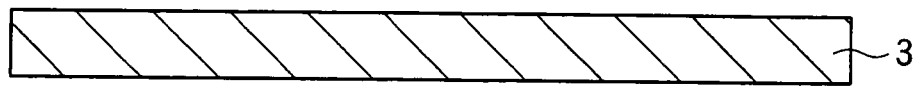
FIGS. 5A through 5F are sectional views for illustrating a manufacturing process of the composite semiconductor device according to the first embodiment.

First, as shown in FIG. 5A, the semiconductor substrate 3 composed of, for example, Si is prepared.

Figure 5B:
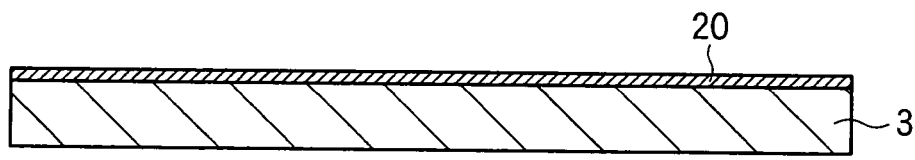

Next, as shown in FIG. 5B, a conductive layer 20 (for forming the wiring layer 2) such as AlSiCu, AlSi, AlNi, AlTi and AlCr, Cu are formed on the semiconductor substrate 3.

Figure 5C:
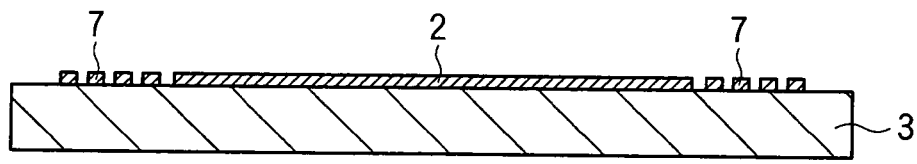

Then, as shown in FIG. 5C, the conductive layer 20 is patterned using conventional photolithography, so as to form the wiring layer 2 and the separate pattern portion 7.

Figure 5D:
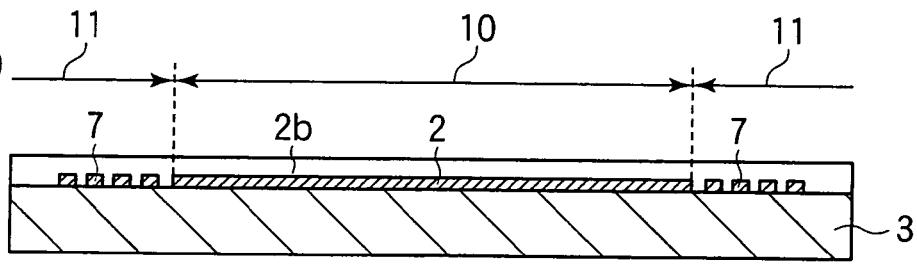

Next, as shown in FIG. 5D, the insulation film 2b is formed on the wiring layer 2 and the separate pattern portion 7 on the semiconductor substrate 3.

Figure 5E:
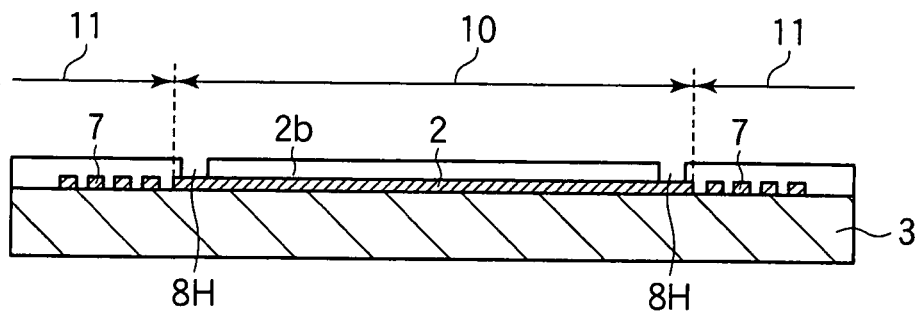

Then, as shown in FIG. 5E, holes 8H are formed through the insulation film 2b in the vicinity of the ends of the device-forming area 10 so that the holes 8H reach the surface of the wiring layer 2.

Figure 5F:
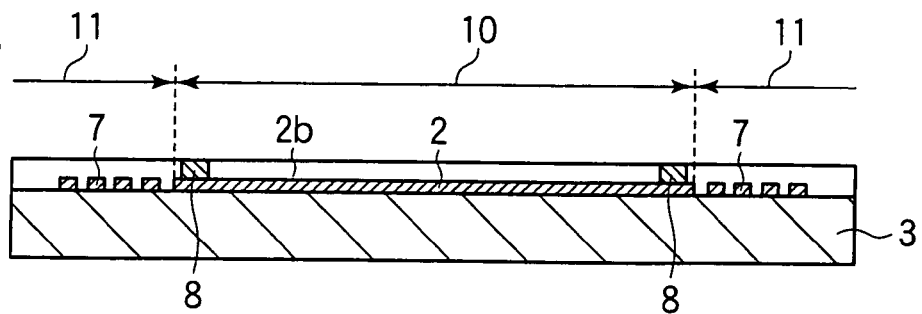

Next, as shown in FIG. 5F, the connecting portions 8 of tungsten or the like are formed in the holes 8H.

The processes of FIGS. 5A through 5F are repeated so that a plurality of the wiring layers 2 and insulation films 2b are layered as shown in FIG. 1B.

Figure 6A:
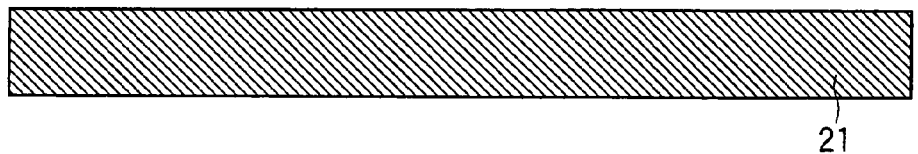
FIGS. 6A through 6F are sectional views for illustrating the manufacturing processes of the composite semiconductor device according to the first embodiment.

The semiconductor wafer obtained by the processes of FIGS. 5A through 5F is expressed as a "semiconductor wafer 21" as shown in FIG. 6A. The detail of the semiconductor wafer 21 is omitted in FIGS. 6A through 6F.

Figure 6B:
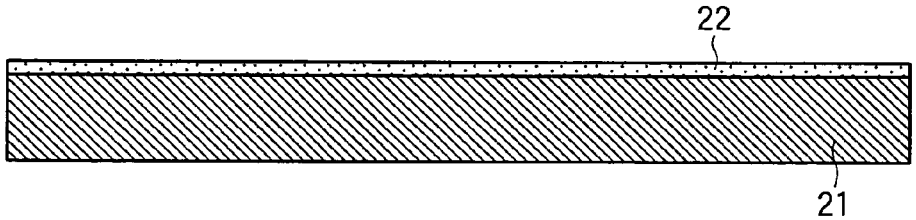

Next, as shown in FIG. 6B, a semiconductor thin-film layer 22 for forming the semiconductor elements 1 (i.e., driven elements) and the semiconductor thin-film layer 15 is bonded onto the upper surface of the semiconductor wafer 21. The semiconductor thin-film layer 22 is composed of, for example, a compound semiconductor such as III-V compound semiconductor, for example, GaAs, AlGaAs or the like.

Figure 6C:
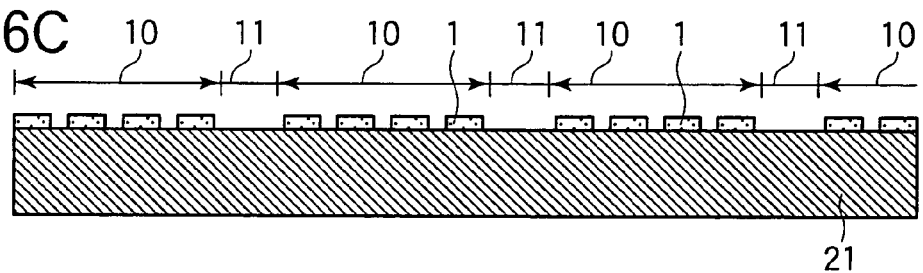

Then, as shown in FIG. 6C, the semiconductor thin-film layer 22 is patterned using a conventional photolithography so as to form a plurality of semiconductor elements 1 and the semiconductor thin-film layer 15 (omitted in FIG. 6C) in the device-forming area 10. Further, wirings are formed for electrically connecting the semiconductor elements 1 and driving circuits (not shown).

Figure 6D:
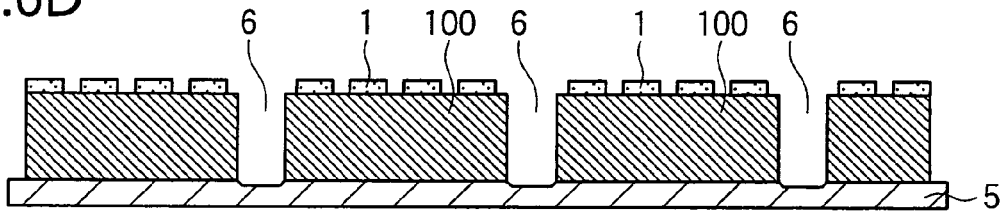

Next, as shown in FIG. 6D, cutting grooves 6 are formed on the semiconductor wafer 21 at the dicing area 11 (between the semiconductor elements 1) using the dicing blade to thereby divide the semiconductor wafer 21 into a plurality of chips, so as to obtain a plurality of composite semiconductor devices 100 as was described with reference to FIGS. 1A and 1B.

In this dicing process, the ultraviolet curable dicing tape 5 is bonded onto the backside of the semiconductor wafer 21 to prevent the respective chips (i.e., the composite semiconductor devices 100) from scattering.

Figure 6E:
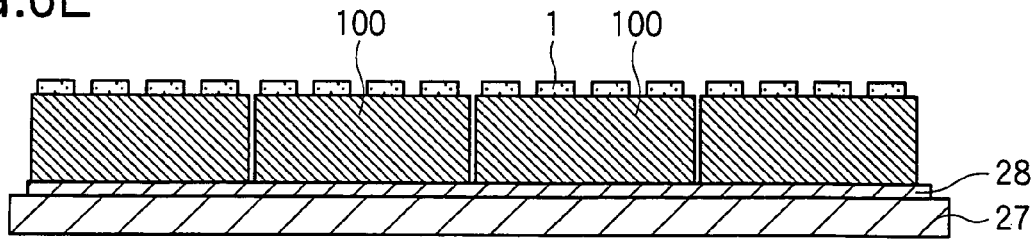
Figure 6F:
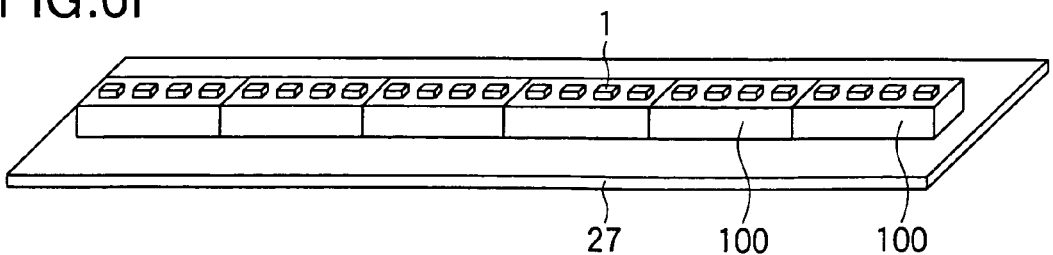

A plurality of composite semiconductor devices 100 are bonded onto a mounting substrate 27 composed of glass epoxy substrate using a dice bond paste 28 or the like as shown in FIG. 6E, for manufacturing the LED array head. The composite semiconductor devices 100 are arranged on a line. With such a dice bonding process, an LED array head using the composite semiconductor devices 100 as shown in FIG. 6F is obtained.

As described above, according to the first embodiment of the present invention, the connecting portion 8 (connecting the wiring layers 2) is disposed on the device-forming area 10 side with respect to the dicing position, and the connecting portion 8 having excellent adhesion property prevents the propagation of the crack 4 to the inside of the device-forming area 10. Accordingly, yield ratio in the manufacturing process of the composite semiconductor device 100 can be enhanced.

Modification.

Figure 7:
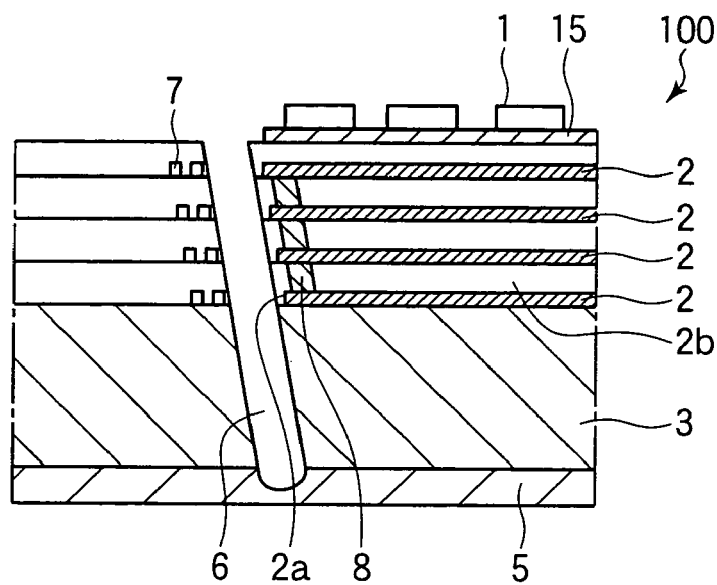
FIG. 7 is a sectional view for schematically illustrating a modification of the first embodiment of the present invention.

FIG. 7 is a sectional view of a composite semiconductor device 100 according to the modification of the first embodiment of the present invention.

As shown in FIG. 7, there are cases where the dicing is performed at an angle with respect to a thickness direction of the semiconductor substrate 3 (i.e., the layering direction of the wiring layers 2). Such a dicing is referred to as "oblique dicing".

In this modification, ends 2a of the wiring layers 2 (in the device-forming area 10) are arranged along an oblique cutting groove 6. Therefore, the dicing blade is prevented from directly contacting and damaging the wiring layers 2 in the device-forming area 10. Accordingly, it is possible to prevent the generation of the cracks 4 on the wiring layer 2 due to an impact of the dicing blade.

Each of the connecting portions 8 is disposed on the device-forming area 10 side with respect to the dicing position. In other words, the connecting portions 8 are also arranged along the oblique cutting groove 6. Therefore, the connecting portions 8 are not affected by the dicing blade, and functions to prevent the propagation of the crack to the inside of the device-forming area 10.

Other configurations of the modification are the same as those of the first embodiment (see FIGS. 1A, 1B and 2).

The above described oblique dicing is often used in the high precision dicing between LED chips (the composite semiconductor devices 100), in order to make an interval between endmost LED elements (i.e., endmost semiconductor elements 1) of adjacent LED chips be the same as an interval between adjacent LED elements of the same LED chip (i.e., an interval between light emitting portions).

Figure 8:
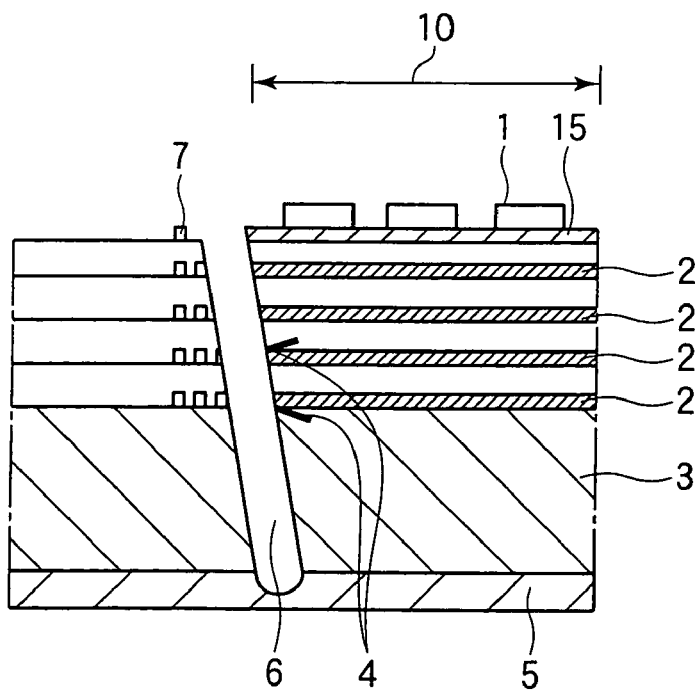
FIG. 8 is a sectional view for schematically illustrating another comparison example.

Here, a comparison example will be described. FIG. 8 is a sectional view of the composite semiconductor device according to the comparison example. In FIG. 8, components that are the same as those shown in FIG. 7 are assigned the same reference numerals.

In the comparison example, the ends of the wiring layers 2 are arranged vertically (i.e., perpendicular to the surface of the semiconductor substrate 3). When the oblique dicing is performed in the close vicinity of the device-forming area 10, the dicing blade (see, the cutting groove 6) directly contacts the wiring layers 2 in the device-forming area 10, and therefore the cracks 4 are generated on the wiring layer 2 in the device-forming area 10 due to the impact of the dicing blade.

In contrast, according to the modification of the first embodiment of the present invention (FIG. 7), the dicing blade is prevented from contacting the wiring layers 2 in the device-forming area 10, and therefore the generation of the cracks 4 on the wiring layer 2 in the device-forming area 10 can be prevented.

Second Embodiment

Figure 9:
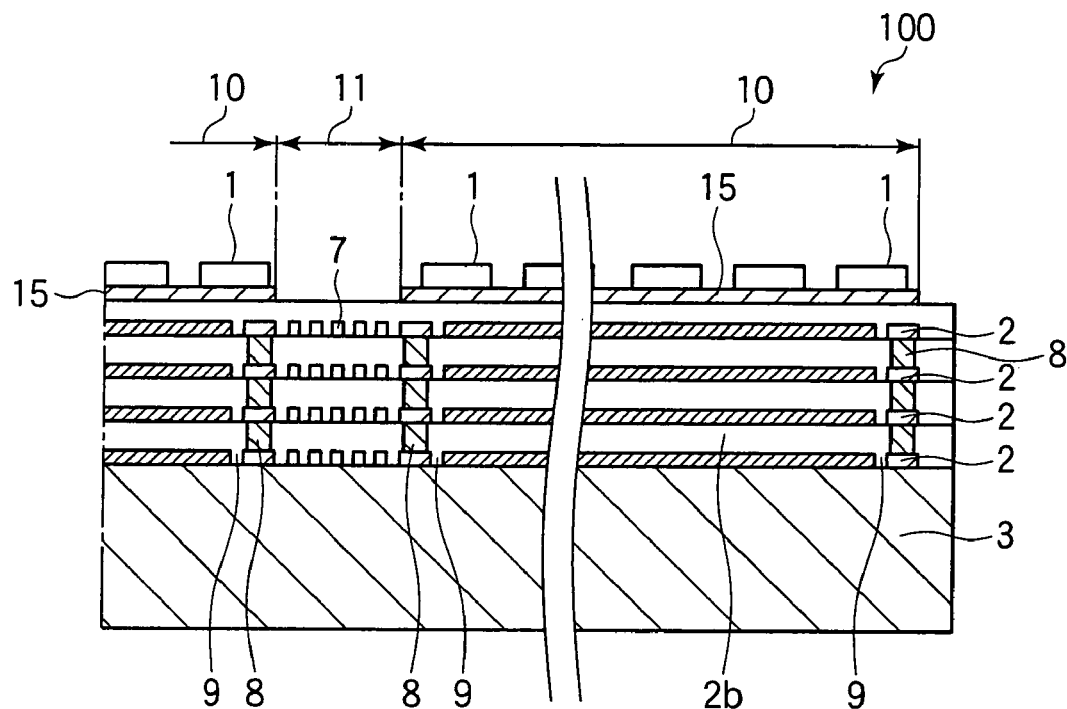
FIG. 9 is a sectional view showing a composite semiconductor device according to the second embodiment of the present invention.

FIG. 9 is a sectional view showing a composite semiconductor device 100 according to the second embodiment of the present invention. In FIG. 9, components that are the same as those of the first embodiment (shown in FIGS. 1A, 1B and 2) are assigned the same reference numerals.

In the second embodiment of the present invention, dividing portions 9 are formed on the device-forming area 10 side with respect to the connecting portions 8. Each dividing portion 9 is formed so as to divide the wiring layer 2. In this regard, it is also possible to provide further dividing portions 9 on each device-forming area 10 side with respect to the connecting portion 8.

The other configurations of the second embodiment are the same as the first embodiment.

The manufacturing process of the composite semiconductor device of the second embodiment is substantially the same as that of the first embodiment (see FIGS. 5A through 6F). In this regard, the dividing portions 9 are formed at the same time as the formation of the wiring layer 2 and the separate pattern portion 7 (see FIG. 5C).

As was described in the first embodiment, the dicing is performed along the dicing line 12 (see FIG. 1A) in the close vicinity of the device-forming area 10. Even when a crack is generated from the cutting groove 6 by the dicing, the connecting portions 8 (having excellent adhesion property) prevent the propagation of the crack to the inside of the device-forming area 10. Further, the dividing portions 9 in the vicinity of the connecting portions 8 prevent the propagation of stress (generated on the wiring layers 2 due to the external force caused by the dicing) to the inside of the device-forming area 10.

Therefore, according to the second embodiment of the present invention, yield rate can be further enhanced.

Modification.

Figure 10:
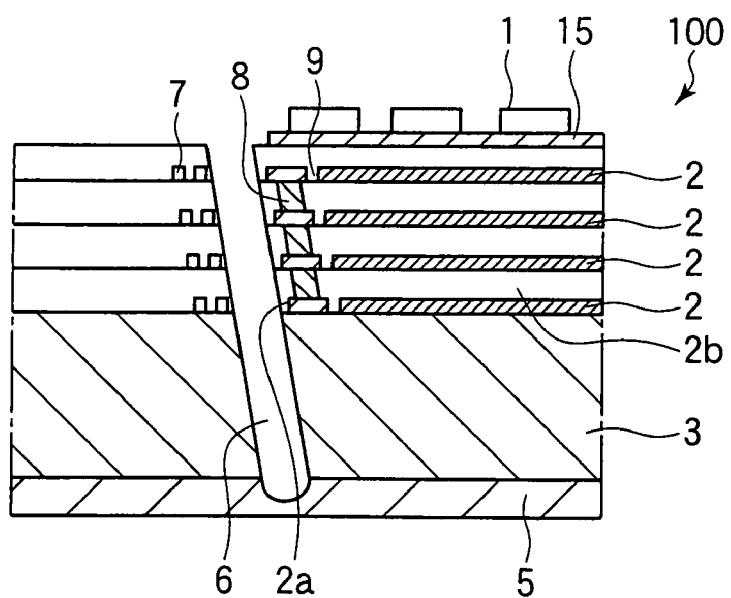
FIG. 10 is a sectional view for schematically illustrating a modification of the second embodiment of the present invention.

FIG. 10 is a sectional view of a composite semiconductor device according to the modification of the second embodiment of the present invention.

In this modification, the oblique dicing (as described with reference to FIG. 7) is performed, and the ends 2a of the wiring layers 2 in the device-forming area 10 are arranged along the oblique cutting groove 6 formed by the dicing blade. Therefore, the dicing blade is prevented from directly contacting and damaging the wiring layers 2 in the device-forming area 10. Accordingly, it is possible to prevent the generation of the cracks 4 on the wiring layer 2 due to the impact of the dicing blade.

Each connecting portion 8 is disposed on the device-forming area 10 side with respect to the dicing position, and each dividing portion 9 is disposed on the device-forming area 10 side with respect to the connecting portion 8. In other words, the connecting portions 8 and the dividing portions 9 are also arranged along the cutting groove 6. Therefore the connecting portions 8 and the dividing portions 9 are not affected by the dicing blade, and respectively function to prevent the propagation of crack and stress to the inside of the device-forming area 10.

Although the dicing in the Y direction (see FIG. 1A) has been described, the first and second embodiments and modifications thereof can be applied to the dicing in the X direction (see FIG. 1A).

Print Head.

Figure 11:
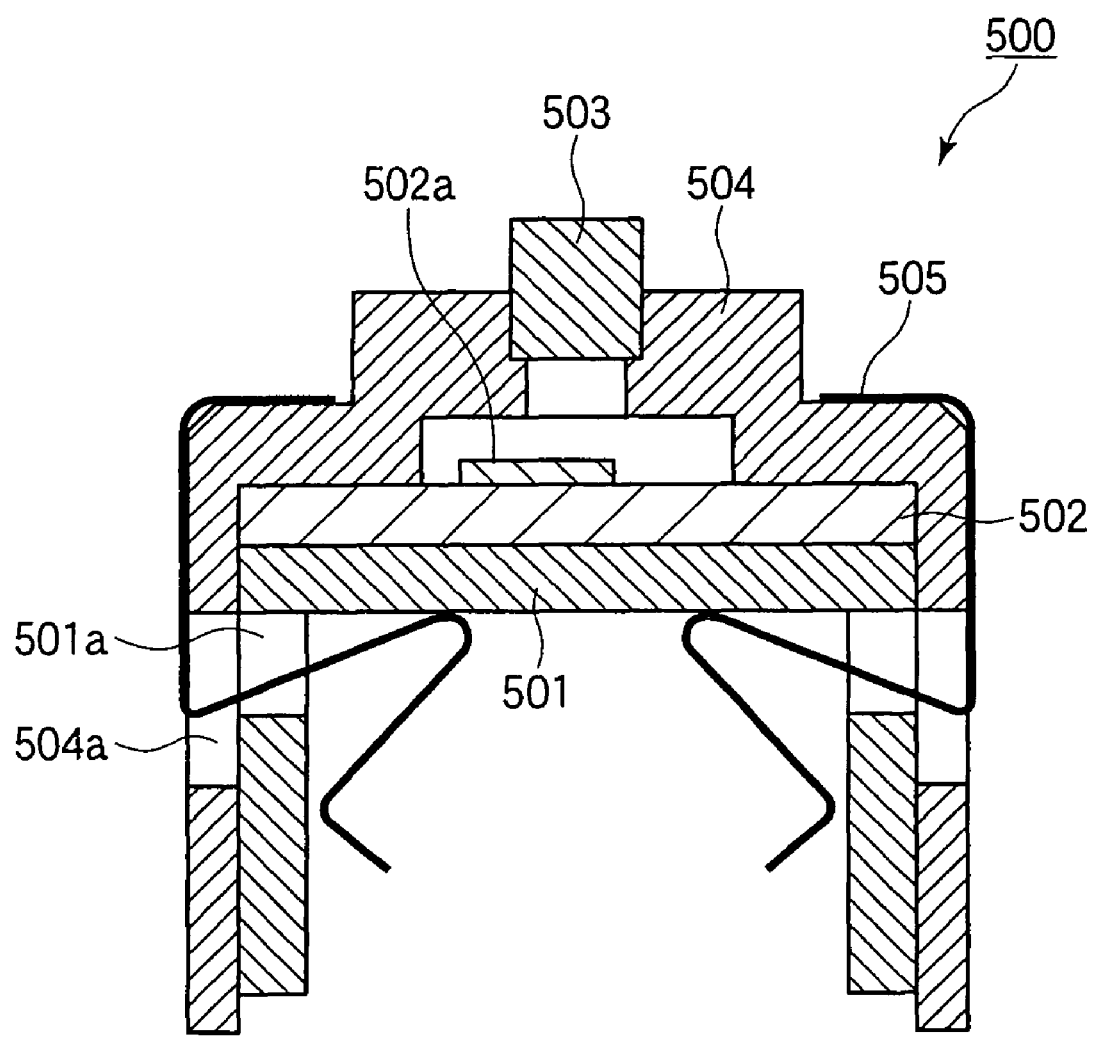
FIG. 11 is a sectional view showing an LED head using the composite semiconductor device according to the embodiments of the present invention.
Figure 12:
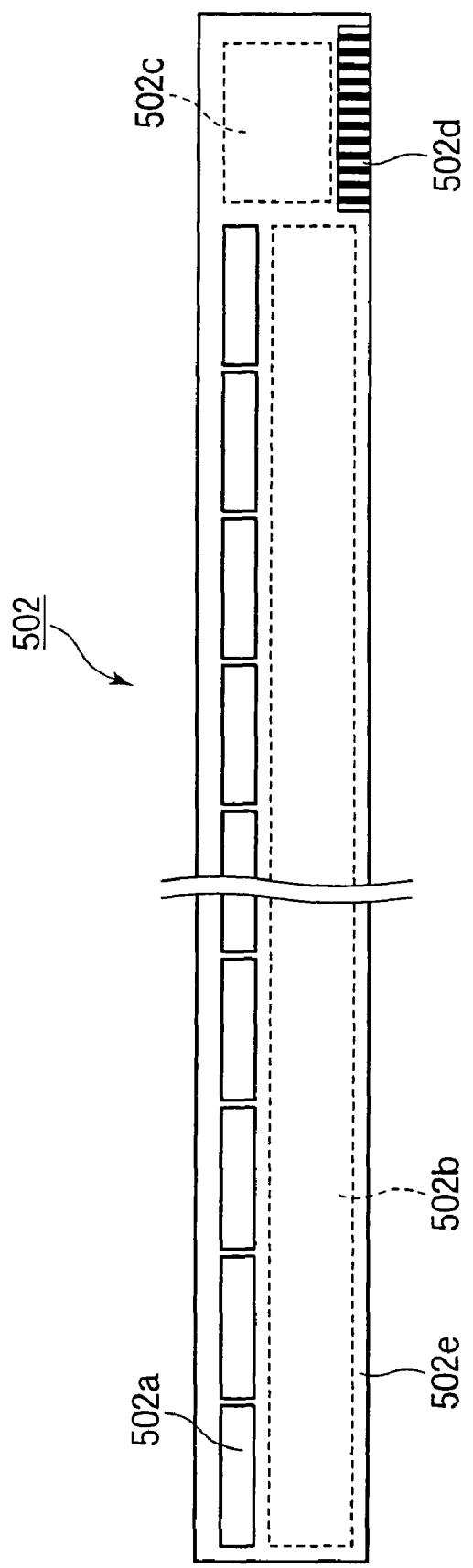
FIG. 12 is a plan view showing an example of an LED unit of the LED head shown in FIG. 11, and FIG. 13 schematically shows a main part of an image forming apparatus using the composite semiconductor device according to the embodiments of the present invention.

Next, a description will be made of an LED head (i.e., a print head) 500 using the composite semiconductor device 100 according to the first and second embodiments of the present invention with reference to FIGS. 11 and 12. FIG. 11 is a sectional view showing the LED head 500 according to the embodiments of the present invention. FIG. 12 is a plan view showing an example of an LED unit 502 of the LED head 500 shown in FIG. 11.

As shown in FIG. 11, the LED head 500 includes a base 501 and an LED unit 502 mounted on the base 501.

As shown in FIG. 12, the LED unit 502 includes a mounting substrate 502e (corresponding to the mounting substrate 27 as shown in FIG. 6F) having an elongated shape, a plurality of LED arrays 502a (corresponding to the composite semiconductor devices 100 as shown in FIG. 6F) mounted on the mounting substrate 502e. The LED arrays 502a include light emitting portions (corresponding to the semiconductor elements 1) linearly arranged in a longitudinal direction of the mounting substrate 502e, and driving circuits (not shown) for driving the light emitting portions. In addition, the mounting substrate 502e has electric components mounting areas 502b and 502c in which electric components are mounted and wirings are formed, a connector 502d for the supply of control signal and electric power from outside, or the like.

Further, as shown in FIG. 11, a rod lens array 503 for focusing the lights emitted by the light emitting portions is provided above the LED array 502a. The rod lens array 503 is composed of a plurality of optical lenses in the form of columns arranged along the light emitting portions of the LED array 502a. The rod lens array 503 is held by a lens holder 504 at a position above the light emitting portions of the LED array 502a.

The lens holder 504 is provided so as to cover the base 501 and the LED unit 502. The base 501, the LED unit 502 and the lens holder 504 are held by a damper 505. The damper 505 is disposed as so to penetrate through opening 501a and 502a formed on the base 501 and the lens holder 504. The lights emitted by the LED unit 502 irradiate a predetermined exterior member via the rod lens array 503. The LED head (i.e., the print head) 500 is used as, for example, an exposing device of an image forming apparatus such as an electrophotographic printer, an electrophotographic copier or the like.

Image Forming Apparatus

Next, a description will be made of an image forming apparatus using the above described exposing device (i.e., the LED head 500) with reference to FIG. 13.

Figure 13:
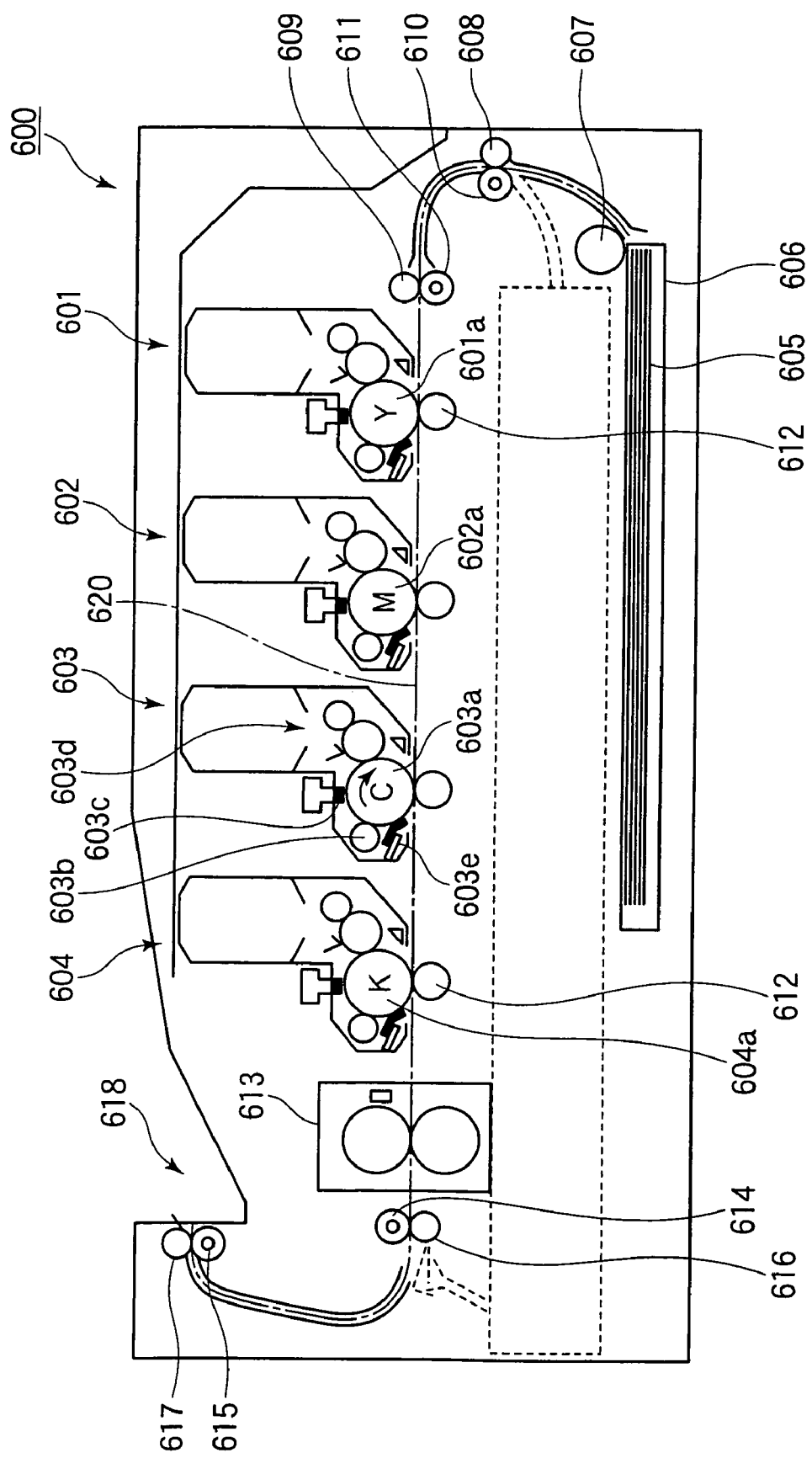

FIG. 13 is a side view for illustrating a main part of the printer 600 as an image forming apparatus using the composite semiconductor devices according to the embodiments of the present invention. As shown in FIG. 13, the printer 600 includes four process units 601, 602, 603 and 604 arranged in this order from an upstream to a downstream along a feeding path 620 of a recording medium 605. The process units 601, 602, 603 and 604 respectively form images of yellow, magenta, cyan and black. The process units 601, 602, 603 and 604 have common internal structures, and therefore the structure of the cyan process unit 603 will be described.

The process unit 603 includes a photosensitive drum 603a as an image bearing body that is rotatable in a direction shown by arrow in FIG. 13. Along the circumference of the photosensitive drum 603a, a charging device 603b that uniformly charges the surface of the photosensitive drum 603a, an exposing device 603c (i.e., the LED head 500 shown in FIG. 11) that selectively exposes the surface of the photosensitive drum 603a to form a latent image, a developing device 603d that develops the latent image on the surface of the photosensitive drum 603a using a toner of a predetermined color (cyan), a cleaning device that removes the residual toner from the surface of the photosensitive drum 603a, or the like in this order along the rotational direction of the photosensitive drum 603a. These rollers and drums are respectively rotated by not a shown driving source via gears.

A sheet cassette 606 is mounted on a lower part of the printer 600. The recording media 605 (such as papers) are stacked in the sheet cassette 606. A hopping roller 607 is disposed on the upper side of the sheet cassette 606. The hopping roller 607 feeds the recording medium 606 one by one out of the sheet cassette 606. Registration rollers 610 and 611 are disposed along the feeding path on the downstream side of the hopping roller 607. Pinch rollers 608 and 609 are disposed respectively facing the registration rollers 610 and 611. The registration rollers 610 and 611 and the pinch rollers 608 and 609 hold the recording medium 605, correct skew of the recording medium 605, and feed the recording medium 605 along the feeding path 620 toward the process units 601, 602, 603 and 604. The hopping roller 607 and the registration rollers 610 and 611 are respectively rotated by a not shown driving source via gears.

Transfer rollers 612 are disposed so as to face the photosensitive drums 601a, 602a, 603a, 604a of the process units 601, 602, 603 and 604. The transfer rollers 612 are composed of semiconductive rubber or the like. Electric potential differences are applied between the surfaces of the photosensitive drums 601a, 602a, 603a and 604a and the surfaces of the transfer rollers 612, so as to transfer the toner images on the photosensitive drums 601a, 602a, 603a and 604a to the recording medium 605.

A fixing device 613 includes a heat roller and a backup roller that apply heat and pressure to the toner image on the recording medium 605 to thereby fix the toner image to the recording medium 605. Ejection rollers 614 and 615 are disposed on the downstream side of the fixing device 613, and pinch rollers 616 and 617 are disposed respectively facing the ejection rollers 614 and 615. The ejection rollers 614 and 615 and the pinch rollers 616 and 617 hold the recording medium 605 and eject the recording medium 605 to a stacker portion 618. The ejection rollers 614 and 615 are continuously rotated by a not shown driving source via gears.

Next, an operation of the printer 600 will be described.

First, the uppermost recording medium 605 of the stack in the sheet cassette 606 is fed out of the sheet cassette 606 by the hopping roller 607. The recording medium 605 is further fed by the registration rollers 610 and 611 and the pinch rollers 608 and 609 to reach a portion between the photosensitive drum 601a of the process unit 601 and the transfer roller 612. In a state where the recording medium 605 is sandwiched between the photosensitive drum 601a and the transfer roller 612, the toner image (formed by the exposing device 601c and developed by the developing device 601d) is transferred from the photosensitive drum 601a to a recording surface of the recording medium 605, and the recording medium 605 is fed to the downstream side.

The recording medium 605 further passes the process units 602, 603 and 604. In this process, the latent images of respective colors formed by the exposing devices 602c, 603c and 604c are developed by the developing devices 602d, 603d and 604d, and the developed toner images are respectively transferred to the recording surface of the recording medium 605 in an overlapping manner. The toner images of respective colors on the recording medium 605 are fixed to the recording medium 605 by the fixing device 613. Thereafter, the recording medium 605 is ejected by ejection rollers 614 and 615 and the pinch rollers 616 and 617 to the outside of the printer 600, and is placed on the stacker portion 618.

With such processes, a color image of high quality is formed on the recording medium 605.

In the above description, the printer has been described as an example of the image forming apparatus. However, the present invention is also applicable to a copier, a facsimile machine, a multifunctional peripheral or the like.

Further, in the above description, the composite semiconductor device 100 with the LED elements 1 has been described as an example of the composite semiconductor device 100. However, it is also possible that the composite semiconductor devices have other elements than LED elements.

While the preferred embodiments of the present invention have been illustrated in detail, it should be apparent that modifications and improvements may be made to the invention without departing from the spirit and scope of the invention as described in the following claims.

What is claimed is:

1. A composite semiconductor device formed of a semiconductor wafer having a plurality of device-forming areas in which semiconductor elements are formed and dicing areas defined between said device-forming areas, and formed by dicing said semiconductor wafer at said dicing areas,
    said composite semiconductor device comprising:
    a semiconductor substrate, and
    a plurality of wiring layers layered on said semiconductor substrate, said wiring layers including at least conductive films,
    wherein connecting portions are formed to connect said wiring layers with each other in a layering direction of said wiring layers, each of said connecting portions being disposed on a device-forming area side with respect to a dicing position defined in said dicing area, and
    wherein ends of said wiring layers are arranged in accordance with an angle at which said semiconductor wafer is diced, each of said ends being disposed on said device-forming area side with respect to said dicing position.

2. The composite semiconductor device according to claim 1, wherein said wiring layers have a dividing portion on said device-forming area side with respect to said connecting portions.

3. A print head, comprising:
    a mounting substrate on which a plurality of said composite semiconductor devices according to claim 1 are linearly arranged; and
    a lens array disposed so as to face said composite semiconductor devices, said lens array being configured to focus lights emitted by said semiconductor elements of said composite semiconductor devices.

4. An image forming apparatus comprising:
    said print head according to claim 3, and
    an image bearing body having a surface exposed by said print head so as to form a latent image on said surface.

5. The composite semiconductor device according to claim 1, wherein said connecting portions are formed along said dicing area.

6. The composite semiconductor device according to claim 1, wherein said connecting portions are formed of a material having an excellent adhesion property with said wiring layers.

7. The composite semiconductor device according to claim 1, wherein said connecting portions are formed of a material having a high corrosion resistance property.

8. The composite semiconductor device according to claim 1, wherein a semiconductor thin-film layer is formed on each of said device-forming areas, and
    wherein said semiconductor thin-film layer is formed of a material which is different from said semiconductor wafer, and said semiconductor thin-film layer includes a plurality of light emitting elements.

* * * * *